United States Patent
Harasawa et al.

(10) Patent No.: US 10,180,811 B2
(45) Date of Patent: Jan. 15, 2019

(54) SEMICONDUCTOR STORAGE DEVICE THAT DYNAMICALLY CHANGES A DATA BUFFERING MANNER

(71) Applicant: Toshiba Memory Corporation, Tokyo (JP)

(72) Inventors: Akinori Harasawa, Tokyo (JP); Yoshihisa Kojima, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/667,498

(22) Filed: Aug. 2, 2017

(65) Prior Publication Data
US 2018/0039448 A1    Feb. 8, 2018

(30) Foreign Application Priority Data

Aug. 2, 2016  (JP) ................. 2016-152034

(51) Int. Cl.
*G11C 7/10* (2006.01)
*G06F 3/06* (2006.01)
(Continued)

(52) U.S. Cl.
CPC .......... *G06F 3/0659* (2013.01); *G06F 3/0607* (2013.01); *G06F 3/0613* (2013.01);
(Continued)

(58) Field of Classification Search
CPC ......... G06F 12/0246; G06F 2212/7205; G06F 2212/7203; G06F 3/0679; G06F 3/064;
(Continued)

(56) References Cited

U.S. PATENT DOCUMENTS 8,527,730 B2    9/2013  Fujimoto
2012/0254524 A1 10/2012 Fujimoto
(Continued)

FOREIGN PATENT DOCUMENTS

| JP | 2009230407 A | 10/2009 |
| JP | 2011175615 A | 9/2011 |
| JP | 2014112351 A | 6/2014 |

OTHER PUBLICATIONS

Information technology—SCSI Block Commands—4 (SBC-4), Working Draft American National Standard, Project, T10/BSR INCITS 506, Revision 13, Feb. 17, 2017, 440 pages.

*Primary Examiner* — Thong Q Le
(74) *Attorney, Agent, or Firm* — Patterson & Sheridan, LLP

(57) ABSTRACT

A semiconductor storage device includes m (m≥2) memory chips, a buffer, and a controller. The controller arranges, in the buffer, a first plurality of data units to be transferred to N (1≤N≤m) of the m memory chips, in an order in which each of the first plurality of data units has been received from a host, for each one of the N memory chips, and arranges a second plurality of data units, if any, in an order in which each of the second plurality of data units has been received from the host, for each one of the next N memory chips. Upon the arranged data units, the controller collectively transfers the certain number of arranged data units to the memory. The value of N is changed based on an amount of data accumulated in the buffer.

18 Claims, 21 Drawing Sheets

(51) Int. Cl.
  *G11C 16/06* (2006.01)
  *G06F 12/02* (2006.01)
  *G11C 16/04* (2006.01)
  *G11C 16/10* (2006.01)
(52) U.S. Cl.
  CPC .......... *G06F 3/0619* (2013.01); *G06F 3/0679* (2013.01); *G06F 12/0246* (2013.01); *G11C 16/06* (2013.01); *G11C 16/0483* (2013.01); *G11C 16/10* (2013.01)
(58) Field of Classification Search
  CPC ...... G06F 11/10; G06F 3/0616; G06F 3/0608; G06F 11/1453; G06F 17/30159; G06F 2212/1032; G06F 3/0641; G06F 3/0688; G06F 11/1446
  USPC ......... 711/103, E12.008, 100, 154, E12.001, 711/E12.009, 102; 365/185.33, 185.11, 365/185.12, 148, 163, 185.03, 185.08, 365/185.18, 185.23, 230.03
  See application file for complete search history.

(56) References Cited

U.S. PATENT DOCUMENTS

2015/0234598 A1    8/2015  Fujimoto
2016/0054930 A1*   2/2016  Dor ...................... G06F 3/0608
                                                      711/102

\* cited by examiner

| | 620 | 600 | | | LOGICAL PAGE | | | 700 | | | | | | | |
|---|---|---|---|---|---|---|---|---|---|---|---|---|---|---|---|
| Ch0 | 0 | 18 | 36 | 54 | 72 | 90 | 108 | 126 | 144 | 162 | 180 | 198 | 216 | 234 | 252 | 270 |
| Ch1 | 1 | 19 | 37 | 55 | 73 | 91 | 109 | 127 | 145 | 163 | 181 | 199 | 217 | 235 | 253 | 271 |
| Ch2 | 2 | 20 | 38 | 56 | 74 | 92 | 110 | 128 | 146 | 164 | 182 | 200 | 218 | 236 | 254 | 272 |
| Ch3 | 3 | 21 | 39 | 57 | 75 | 93 | 111 | 129 | 147 | 165 | 183 | 201 | 219 | 237 | 255 | 273 |
| Ch4 | 4 | 22 | 40 | 58 | 76 | 94 | 112 | 130 | 148 | 166 | 184 | 202 | 220 | 238 | 256 | 274 |
| Ch5 | 5 | 23 | 41 | 59 | 77 | 95 | 113 | 131 | 149 | 167 | 185 | 203 | 221 | 239 | 257 | 275 |
| Ch6 | 6 | 24 | 42 | 60 | 78 | 96 | 114 | 132 | 150 | 168 | 186 | 204 | 222 | 240 | 258 | 276 |
| Ch7 | 7 | 25 | 43 | 61 | 79 | 97 | 115 | 133 | 151 | 169 | 187 | 205 | 223 | 241 | 259 | 277 |
| Ch8 | 8 | 26 | 44 | 62 | 80 | 98 | 116 | 134 | 152 | 170 | 188 | 206 | 224 | 242 | 260 | 278 |
| Ch9 | 9 | 27 | 45 | 63 | 81 | 99 | 117 | 135 | 153 | 171 | 189 | 207 | 225 | 243 | 261 | 279 |
| Ch10 | 10 | 28 | 46 | 64 | 82 | 100 | 118 | 136 | 154 | 172 | 190 | 208 | 226 | 244 | 262 | 280 |
| Ch11 | 11 | 29 | 47 | 65 | 83 | 101 | 119 | 137 | 155 | 173 | 191 | 209 | 227 | 245 | 263 | 281 |
| Ch12 | 12 | 30 | 48 | 66 | 84 | 102 | 120 | 138 | 156 | 174 | 192 | 210 | 228 | 246 | 264 | 282 |
| Ch13 | 13 | 31 | 49 | 67 | 85 | 103 | 121 | 139 | 157 | 175 | 193 | 211 | 229 | 247 | 265 | 283 |
| Ch14 | 14 | 32 | 50 | 68 | 86 | 104 | 122 | 140 | 158 | 176 | 194 | 212 | 230 | 248 | 266 | 284 |
| Ch15 | 15 | 33 | 51 | 69 | 87 | 105 | 123 | 141 | 159 | 177 | 195 | 213 | 231 | 249 | 267 | 285 |
| Ch16 | 16 | 34 | 52 | 70 | 88 | 106 | 124 | 142 | 160 | 178 | 196 | 214 | 232 | 250 | 268 | 286 |
| Ch17 | 17 | 35 | 53 | 71 | 89 | 107 | 125 | 143 | 161 | 179 | 197 | 215 | 233 | 251 | 269 | 287 |

| Ch0 | 0 | 18 | 36 | 54 | 72 | 90 | 108 | 126 | 144 | 162 | 180 | 198 | 216 | 234 | 252 | 270 |
| Ch1 | 1 | 19 | 37 | 55 | 73 | 91 | 109 | 127 | 145 | 163 | 181 | 199 | 217 | 235 | 253 | 271 |
| Ch2 | 2 | 20 | 38 | 56 | 74 | 92 | 110 | 128 | 146 | 164 | 182 | 200 | 218 | 236 | 254 | 272 |
| Ch3 | 3 | 21 | 39 | 57 | 75 | 93 | 111 | 129 | 147 | 165 | 183 | 201 | 219 | 237 | 255 | 273 |
| ⋮ |
| Ch16 | 16 | 34 | 52 | 70 | 88 | 106 | 124 | 142 | 160 | 178 | 196 | 214 | 232 | 250 | 268 | 286 |
| Ch17 | 17 | 35 | 53 | 71 | 89 | 107 | 125 | 143 | 161 | 179 | 197 | 215 | 233 | 251 | 269 | 287 |

FIG. 13A

| 1000a | | 1000a | |
|---|---|---|---|
| WtCnt | MCO | WtCnt | MCO |
| 0 | 0 | 144 | 144 |
| 1 | 1 | 145 | 145 |
| 2 | 2 | 146 | 146 |
| 3 | 3 | 147 | 147 |
| 4 | 4 | 148 | 148 |
| 5 | 5 | 149 | 149 |
| 6 | 6 | 150 | 150 |
| 7 | 7 | 151 | 151 |
| 8 | 8 | 152 | 152 |
| 9 | 9 | 153 | 153 |
| 10 | 10 | 154 | 154 |
| 11 | 11 | 155 | 155 |
| 12 | 12 | 156 | 156 |
| 13 | 13 | 157 | 157 |
| 14 | 14 | 158 | 158 |
| 15 | 15 | 159 | 159 |
| 16 | 16 | 160 | 160 |
| 17 | 17 | 161 | 161 |
| 18 | 18 | 162 | 162 |
| 19 | 19 | 163 | 163 |
| 20 | 20 | 164 | 164 |
| 21 | 21 | 165 | 165 |
| 22 | 22 | 166 | 166 |
| 23 | 23 | 167 | 167 |
| 24 | 24 | 168 | 168 |
| 25 | 25 | 169 | 169 |
| 26 | 26 | 170 | 170 |
| 27 | 27 | 171 | 171 |
| 28 | 28 | 172 | 172 |
| 29 | 29 | 173 | 173 |
| 30 | 30 | 174 | 174 |
| 31 | 31 | 175 | 175 |
| 32 | 32 | 176 | 176 |
| 33 | 33 | 177 | 177 |
| 34 | 34 | 178 | 178 |
| 35 | 35 | 179 | 179 |
| ... | ... | ... | ... |
| 135 | 135 | 279 | 279 |
| 136 | 136 | 280 | 280 |
| 137 | 137 | 281 | 281 |
| 138 | 138 | 282 | 282 |
| 139 | 139 | 283 | 283 |
| 140 | 140 | 284 | 284 |
| 141 | 141 | 285 | 285 |
| 142 | 142 | 286 | 286 |
| 143 | 143 | 287 | 287 |

FIG. 13B

| WtCnt | MCO | WtCnt | MCO |
|---|---|---|---|
| 0 | 0 | 144 | 9 |
| 1 | 1 | 145 | 10 |
| 2 | 2 | 146 | 11 |
| 3 | 3 | 147 | 12 |
| 4 | 4 | 148 | 13 |
| 5 | 5 | 149 | 14 |
| 6 | 6 | 150 | 15 |
| 7 | 7 | 151 | 16 |
| 8 | 8 | 152 | 17 |
| 9 | 18 | 153 | 27 |
| 10 | 19 | 154 | 28 |
| 11 | 20 | 155 | 29 |
| 12 | 21 | 156 | 30 |
| 13 | 22 | 157 | 31 |
| 14 | 23 | 158 | 32 |
| 15 | 24 | 159 | 33 |
| 16 | 25 | 160 | 34 |
| 17 | 26 | 161 | 35 |
| 18 | 36 | 162 | 45 |
| 19 | 37 | 163 | 46 |
| 20 | 38 | 164 | 47 |
| 21 | 39 | 165 | 48 |
| 22 | 40 | 166 | 49 |
| 23 | 41 | 167 | 50 |
| 24 | 42 | 168 | 51 |
| 25 | 43 | 169 | 52 |
| 26 | 44 | 170 | 53 |
| 27 | 54 | 171 | 63 |
| 28 | 55 | 172 | 64 |
| 29 | 56 | 173 | 65 |
| 30 | 57 | 174 | 66 |
| 31 | 58 | 175 | 67 |
| 32 | 59 | 176 | 68 |
| 33 | 60 | 177 | 69 |
| 34 | 61 | 178 | 70 |
| 35 | 62 | 179 | 71 |
| ... | ... | ... | ... |
| 135 | 270 | 279 | 279 |
| 136 | 271 | 280 | 280 |
| 137 | 272 | 281 | 281 |
| 138 | 273 | 282 | 282 |
| 139 | 274 | 283 | 283 |
| 140 | 275 | 284 | 284 |
| 141 | 276 | 285 | 285 |
| 142 | 277 | 286 | 286 |
| 143 | 278 | 287 | 287 |

| WtCnt | MCO |
|---|---|
| 0 | 0 |
| 1 | 18 |
| 2 | 36 |
| 3 | 54 |
| 4 | 72 |
| 5 | 90 |
| 6 | 108 |
| 7 | 126 |
| 8 | 144 |
| 9 | 162 |
| 10 | 180 |
| 11 | 198 |
| 12 | 216 |
| 13 | 234 |
| 14 | 252 |
| 15 | 270 |
| 16 | 1 |
| 17 | 19 |
| 18 | 37 |
| 19 | 55 |
| 20 | 73 |
| 21 | 91 |
| 22 | 109 |
| 23 | 127 |
| 24 | 145 |
| 25 | 163 |
| 26 | 181 |
| 27 | 199 |
| 28 | 217 |
| 29 | 235 |
| 30 | 253 |
| 31 | 271 |
| 32 | 2 |
| 33 | 20 |
| 34 | 38 |
| 35 | 56 |
| ... | ... |
| 135 | 134 |
| 136 | 152 |
| 137 | 170 |
| 138 | 188 |
| 139 | 206 |
| 140 | 224 |
| 141 | 242 |
| 142 | 260 |
| 143 | 278 |

(1000c)

| WtCnt | MCO |
|---|---|
| 144 | 9 |
| 145 | 27 |
| 146 | 45 |
| 147 | 63 |
| 148 | 81 |
| 149 | 99 |
| 150 | 117 |
| 151 | 135 |
| 152 | 153 |
| 153 | 171 |
| 154 | 189 |
| 155 | 207 |
| 156 | 225 |
| 157 | 243 |
| 158 | 261 |
| 159 | 279 |
| 160 | 10 |
| 161 | 28 |
| 162 | 46 |
| 163 | 64 |
| 164 | 82 |
| 165 | 100 |
| 166 | 118 |
| 167 | 136 |
| 168 | 154 |
| 169 | 172 |
| 170 | 190 |
| 171 | 208 |
| 172 | 226 |
| 173 | 244 |
| 174 | 262 |
| 175 | 280 |
| 176 | 11 |
| 177 | 29 |
| 178 | 47 |
| 179 | 65 |
| ... | ... |
| 279 | 143 |
| 280 | 161 |
| 281 | 179 |
| 282 | 197 |
| 283 | 215 |
| 284 | 233 |
| 285 | 251 |
| 286 | 269 |
| 287 | 287 |

(1000c)

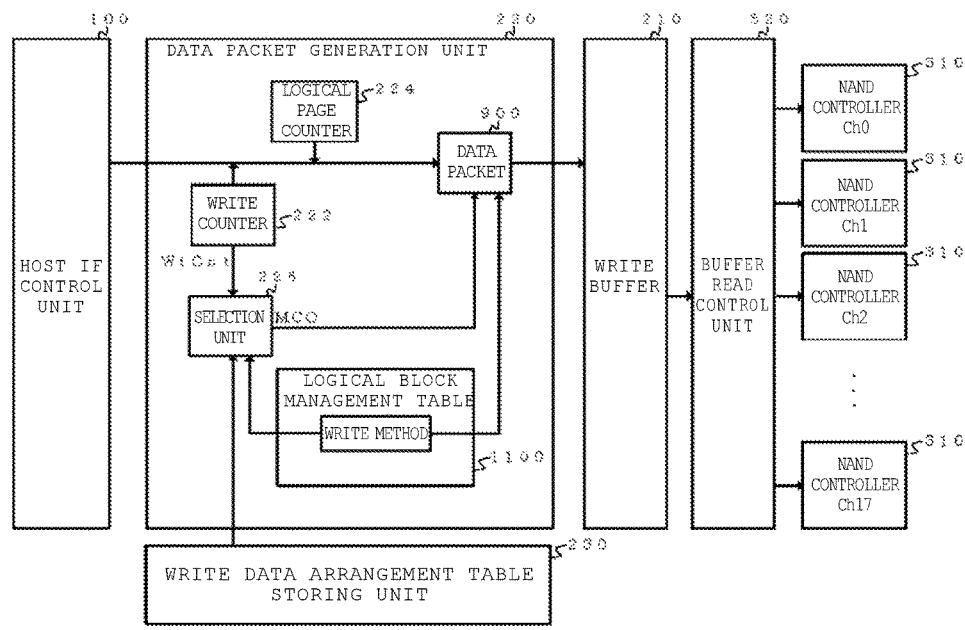

FIG. 28A

| No | START LBA | END LBA | ACCUMULATED AMOUNT | GENERATION |
|---|---|---|---|---|
| 0 | | | | |
| 1 | | | | |
| 2 | | | | |

LONG DETERMINATION FLAG = 0

↓ COMMAND A
START LBA=0x1000
TRANSFER LENGTH=0x200

FIG. 28B

| No | START LBA | END LBA | ACCUMULATED AMOUNT | GENERATION |
|---|---|---|---|---|
| 0 | 0x1000 | 0x11FF | 0x200 | 1 |
| 1 | | | | |
| 2 | | | | |

LONG DETERMINATION FLAG = 0

↓ COMMAND B
START LBA=0x1200
TRANSFER LENGTH=0x100

FIG. 28C

| No | START LBA | END LBA | ACCUMULATED AMOUNT | GENERATION |
|---|---|---|---|---|
| 0 | 0x1000 | 0x12FF | 0x300 | 1 |
| 1 | | | | |
| 2 | | | | |

LONG DETERMINATION FLAG = 0

↓ COMMAND C
START LBA=0x1400
TRANSFER LENGTH=0x200

FIG. 28D

| No | START LBA | END LBA | ACCUMULATED AMOUNT | GENERATION |
|---|---|---|---|---|
| 0 | 0x1000 | 0x12FF | 0x300 | 2 |
| 1 | 0x1400 | 0x15FF | 0x200 | 1 |
| 2 | | | | |

LONG DETERMINATION FLAG = 0

↓ COMMAND D
START LBA=0x0E00
TRANSFER LENGTH=0x100

FIG. 28E

| No | START LBA | END LBA | ACCUMULATED AMOUNT | GENERATION |
|---|---|---|---|---|
| 0 | 0x1000 | 0x12FF | 0x300 | 3 |
| 1 | 0x1400 | 0x15FF | 0x200 | 2 |
| 2 | 0x0E00 | 0x0EFF | 0x100 | 1 |

LONG DETERMINATION FLAG = 0

↓ COMMAND E
START LBA=0x1300
TRANSFER LENGTH=0x100

FIG. 28F

| No | START LBA | END LBA | ACCUMULATED AMOUNT | GENERATION |
|---|---|---|---|---|
| 0 | 0x1000 | 0x15FF | 0x600 | 1 |
| 1 | | | | |
| 2 | 0x0E00 | 0x0EFF | 0x100 | 2 |

LONG DETERMINATION FLAG = 0

↓ COMMAND F
START LBA=0x0F00
TRANSFER LENGTH=0x100

FIG. 28G

| No | START LBA | END LBA | ACCUMULATED AMOUNT | GENERATION |
|---|---|---|---|---|
| 0 | | | | |
| 1 | | | | |
| 2 | 0x0E00 | 0x15FF | 0x800 | 1 |

LONG DETERMINATION FLAG = 1

FIG. 30

LOGICAL BLOCK MANAGEMENT TABLE 1100

| LOGICAL BLOCK ID | STREAM ID | LONG | WRITE METHOD |
|---|---|---|---|
| #0 | 1 | − | 9-CHANNEL-WIDE STRIPE WRITING |
| #1 | 2 | ○ | WIDEST STRIPE WRITING |
| #2 | 2 | ○ | |
| #3 | 3 | − | 9-CHANNEL-WIDE STRIPE WRITING |
| #4 | 3 | − | |
| #5 | 4 | ○ | WIDEST STRIPE WRITING |

US 10,180,811 B2

SEMICONDUCTOR STORAGE DEVICE THAT DYNAMICALLY CHANGES A DATA BUFFERING MANNER

CROSS-REFERENCE TO RELATED APPLICATION

This application is based upon and claims the benefit of priority from Japanese Patent Application No. 2016-152034, filed Aug. 2, 2016, the entire contents of which are incorporated herein by reference.

FIELD

Embodiments described herein relate generally to a semiconductor storage device.

BACKGROUND

In a semiconductor storage device having a nonvolatile semiconductor memory, it would be desirable to reduce the number of times of data erasing to maintain reliability and at the same time have high read/write performance.

DESCRIPTION OF THE DRAWINGS

FIG. 13A illustrates a configuration of a write data arrangement table corresponding to the first write method according to the first embodiment.

FIG. 13B illustrates a configuration of a write data arrangement table corresponding to the second write method according to the first embodiment.

FIG. 13C illustrates a configuration of a write data arrangement table corresponding to the third write method according to the first embodiment.

FIG. 14 illustrates a configuration of a data packet generation unit according to the first embodiment.

FIG. 15 illustrates a STREAM CONTROL command conforming to the SCSI standard.

FIGS. 28A to 28G illustrate a configuration of a long sequential determination table according to the second embodiment.

FIG. 30 illustrates a configuration of a logical block management table according to the second embodiment.

DETAILED DESCRIPTION

Figure 1:
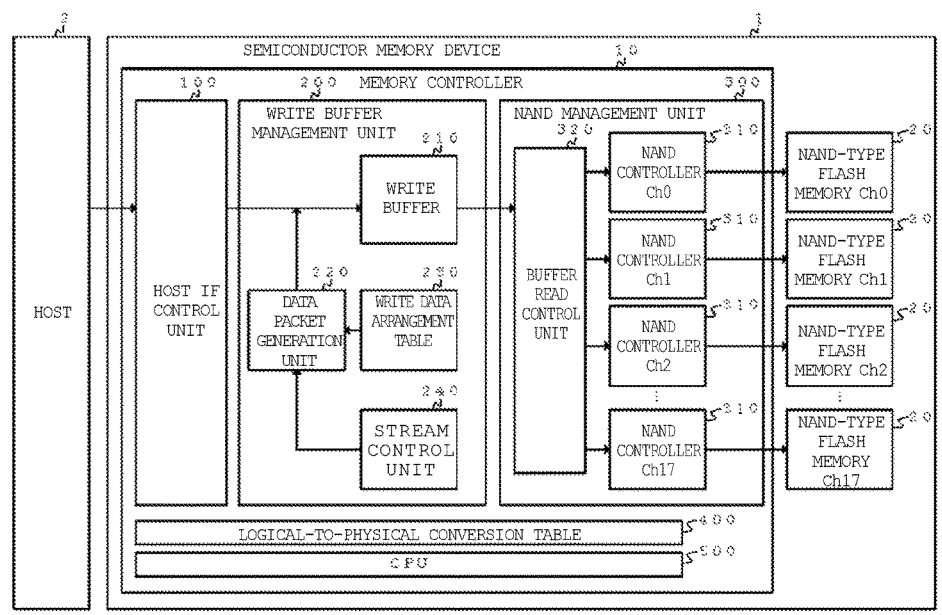
FIG. 1 is a block diagram of a semiconductor storage device according to a first embodiment.

An embodiment is directed to improving performance of a semiconductor storage device.

In general, according to an embodiment, a semiconductor storage device includes m (m≥2) nonvolatile semiconductor memory chips, a buffer, and a controller. The controller is configured to arrange, in the buffer, a first plurality of data units to be transferred to N (1≤N≤m) of the m memory chips, in an order in which each of the first plurality of data units has been received from a host for each one of the N memory chips. The controller then arranges a second plurality of data units to be transferred to next N of the m memory chips, if any, in an order in which each of the second plurality of data units has been received from the host for each one of the next N memory chips. Upon the arranged data units for each memory having been accumulated to a certain amount in the buffer, the controller collectively transfers the certain amount of arranged data units to the memory. The value of N is changed based on the amount of data accumulated in the buffer.

In the following, a semiconductor memory device according to an embodiment will be described with reference to the drawings. In the following description, elements having the same function and configuration are denoted by common reference numerals.

First Embodiment

FIG. 1 is a block diagram of a semiconductor memory (storage) device 1 according to a first embodiment.

The semiconductor memory device 1 includes a memory controller 10 which communicates with a host 2 and controls the entire operation of the semiconductor memory device 1, and a plurality of nonvolatile semiconductor memory chips 20 for storing data. In the following description, description for functional blocks that work to read data from the nonvolatile semiconductor memory 20 is omitted.

In the present embodiment, the host 2 is a computer which supports an interface conforming to the serial attached SCSI (SAS) standard, but may be another computer which supports an interface conforming to other standards, for example, the serial ATA (SATA) standard or the NVM Express (NVMe®) standard.

The memory controller 10 is, for example, a semiconductor integrated circuit configured as a system on a chip (SoC).

The nonvolatile semiconductor memory 20 according to the present embodiment is a NAND-type flash memory, but may be other types of nonvolatile semiconductor memory chips such as a NOR type flash memory or a magneto resistive random access memory (MRAM).

In the following description, the nonvolatile semiconductor memory 20 may be denoted as the NAND-type flash memory 20. The semiconductor memory device 1 according to the present embodiment includes the NAND-type flash memory 20 with 18 channels (Chs). In the following, respective NAND-type flash memory chips 20 are denoted as the NAND-type flash memory chips Ch0 to Ch17. The number of channels may be greater than or less than 18.

The memory controller 10 includes a host interface (IF) control unit 100 performing interpretation and execution of a command received from the host 2, a write buffer management unit 200 performing, for example, the management of the write buffer, a NAND management unit 300 managing writing of data into the NAND-type flash memory 20, a logical-to-physical conversion table 400 used for conversion between a logical address designated by the command from the host 2 and a physical address of the NAND-type flash memory 20, and a central processing unit (CPU) 500 performing control of the overall behavior of the semiconductor memory device 1 based on firmware (FW).

The host 2 sends a write command associated with data to the semiconductor memory device 1. The write buffer management unit 200 includes a write buffer 210 that temporarily stores data received from the host 2 with a write command, a data packet generation unit 220 that processes data stored in the write buffer 210 to form a data packet, a write data arrangement table 230 that stores an arrangement table of data written in the NAND-type flash memory 20, and a stream control unit 240 that performs write control of stream data (described below). The write buffer 210 according to the present embodiment is a memory made of a static random access memory (SRAM), but may be other types of memory such as a dynamic random access memory (DRAM).

The NAND management unit 300 includes NAND controllers 310 (in the following, may be denoted as NAND controllers Ch0 to Ch17) that are connected to respective NAND-type flash memory chips Ch0 to Ch17 and control operations such as writing, reading, erasing and the like with respect to the NAND-type flash memory 20, and a buffer read control unit 320 that transfers a data packet read from the write buffer 210 to each NAND controller 310.

The write buffer 210 and the CPU 500 may be used as separate semiconductor integrated circuits without being built in the memory controller 10. In the following description, some or all of functions performed in accordance with execution of FW may also be carried out by dedicated hardware (HW) and some or all of functions carried out by HW may also be performed by execution of FW.

Next, a configuration of a physical page 600 and a physical block 610 of the NAND-type flash memory 20 according to the present embodiment will be described with reference to FIG. 2A and FIG. 2B.

Figure 2A:
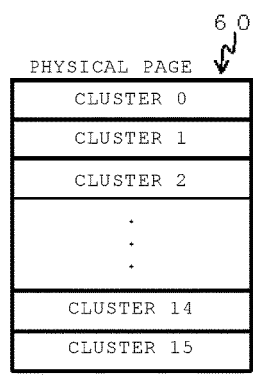
FIGS. 2A and 2B illustrate a configuration of a physical page and a physical block according to the first embodiment.

As illustrated in FIG. 2A, a minimum management unit in the semiconductor memory device 1 upon reading and writing data from and to the NAND-type flash memory 20 is called a cluster 620. In the present embodiment, a size of the cluster 620 is assumed to be 4 kB. A minimum circuit configuration unit (first unit) with which reading and writing in the NAND-type flash memory 20 (reading data from the memory cell array 24 into the page buffer 22 and writing data in the page buffer 22 into the memory cell array 24 in FIG. 3) can be carried out is called the physical page 600. In the present embodiment, a size of the physical page 600 is assumed to be equal to 16 clusters (4 kB×16 clusters=64 kB).

Figure 2B:
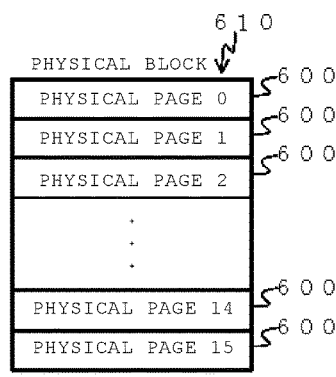

As illustrated in FIG. 2B, a minimum circuit configuration unit (second unit) with which erasing of data in the NAND-type flash memory 20 can be carried out is called a physical block 610. In the present embodiment, a size of the physical block 610 is assumed to be equal to 16 physical pages (64 kB×16 physical pages=1,204 kB), that is, 256 clusters. The sizes represented by the respective units are an example and values of the sizes are not limited. In order to extend the life of the NAND-type flash memory 20, it is preferable to reduce the number of times of erasing as much as possible.

One single page 600 belongs to only one physical block 610. That is, a single physical page 600 does not extend across two or more physical blocks 610. That is, data written in a single physical page 600 can be erased at one time.

Next, a configuration of the NAND-type flash memory 20 according to the present embodiment will be described with reference to FIG. 3.

The NAND-type flash memory 20 includes a page buffer 22 that temporarily stores data in a volatile manner and a memory cell 24 that stores data in a nonvolatile manner.

In the present embodiment, a size of the page buffer 22 is equivalent to a size of data corresponding to a single physical page. That is, the size of the page buffer 22 is 16 clusters. Data stored in the page buffer 22 can be written into the memory cell 24 at one time. In order to improve performance of writing, writing into the memory cell 24 is performed after the entire buffer space of the page buffer 22 is filled with data.

Next, a configuration of a logical page 700, which is a unit of reading and writing data from and to the plurality of NAND-type flash memory chips 20 by the memory controller 10 according to the present embodiment, will be described with reference to FIG. 4.

Figures 3, 4:
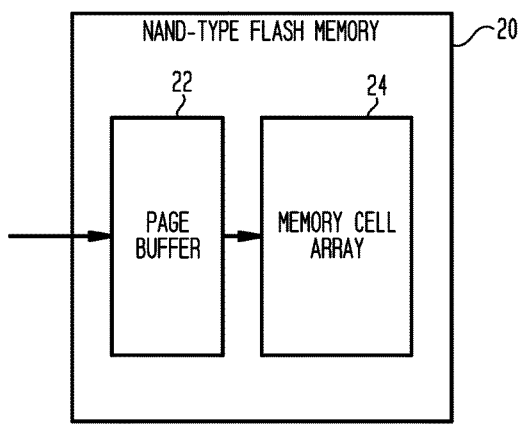
FIG. 3 is a block diagram of a NAND-type flash memory according to the first embodiment.
FIG. 4 illustrates a configuration of a logical page according to the first embodiment.

A single cell in FIG. 4 represents a cluster 620. A number called a media cluster offset (in the following, denoted as MCO) is allocated to each cluster. A location of each cluster in the logical page 700 is specified by the MCO.

A single horizontal row (16 clusters) corresponding to each NAND-type flash memory 20 is a physical page 600. That is, a size of the logical page 700 corresponds to 18 physical pages in the present embodiment.

Next, a configuration of a logical block 800, which is a unit of erasing of data from the plurality of NAND-type flash memory chips 20 by the memory controller 10 according to the present embodiment, will be described with reference to FIG. 5A and FIG. 5B.

Figure 5A:
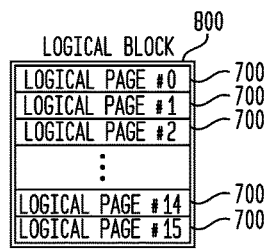
FIGS. 5A and 5B illustrate a configuration of a logical block according to the first embodiment.

As illustrated in FIG. 5A, a size of the logical block 800 corresponds to 16 logical pages in the present embodiment. All clusters of each NAND-type flash memory 20 are uniquely specified by a combination of a logical block ID, a logical page number, and an MCO.

Figure 5B:
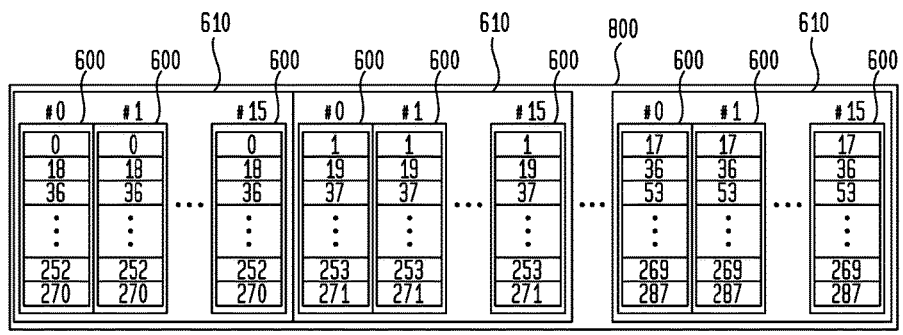

As illustrated in FIG. 5B, a set of physical pages 600 including the same MCO group in a logical block 800 belongs to a single physical block 610. For example, a set of a physical page #0 to physical page #15 including MCO=0, 18, 36, ..., 252, 270 in a logical block belongs to a single physical block 610 of the NAND-type flash memory Ch0. A set of a physical page #0 to physical page #15 including MCO=1, 19, 37, ..., 253, 271 in the logical block belongs to a single physical block 610 of the NAND-type flash memory Ch1. Similarly, a set of a physical page #0 to a physical page #15 including MCO=17, 35, 53, ..., 269, 287 in the logical block belongs to a single physical block 610 of the NAND-type flash memory Ch17.

That is, 18 physical blocks of a single physical block of the NAND-type flash memory Ch0 to a single physical block of the NAND-type flash memory Ch17 are included in a logical block 800. The memory controller 10 performs erase processing not for each physical block 610 independently, which is the minimum erase unit of data of the NAND-type flash memory 20 but for each logical block 800.

Figure 6:
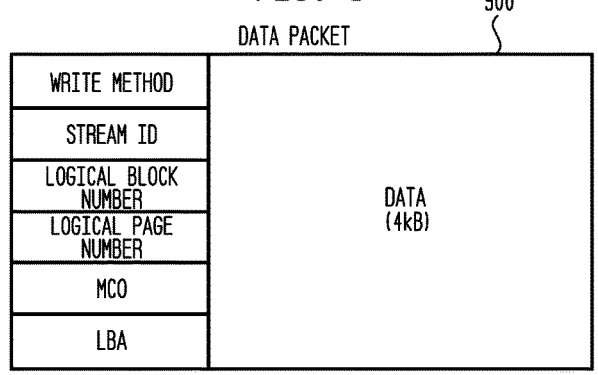
FIG. 6 illustrates a configuration of a data packet according to the first embodiment.

Next, a configuration of a data packet 900 according to the present embodiment will be described with reference to FIG. 6.

The data packet generation unit 220 appends a header to data received from the host IF control unit 100 for each single cluster to generate the data packet 900. The generated data packet 900 is stored in the write buffer 210.

Information used for control by the NAND management unit 300 is stored in the header.

A logical block address (LBA) indicates an LBA of the leading sector of data stored in the data packet 900 using a logical address of a sector unit (for example, 512 B) managed by the host 2.

A physical address, that is a combination of a logical block ID, a logical page number and an MCO identifies a cluster in NAND-type flash memory chips 20 data stored in the data packet 900 are to be written into. The stream ID is an identifier for identifying stream data (described below). The write method indicates one of write methods (described below) to be used.

Next, a first method of writing data into the NAND-type flash memory 20 by the memory controller 10 according to the present embodiment will be described with reference to FIG. 7.

According to the first method, the memory controller 10 arranges pieces of data received from the host 2 in order of MCO in each logical page 700; i.e. a breadth-first manner. That is, in each logical page 700, a piece of data received first is arranged at MCO=0, a piece of data subsequently received is arranged at MCO=1, and a piece of data subsequently received is arranged at MCO=2. A piece of data received subsequent to MCO=17 is arranged at MCO=18. In the following, the first method is denoted as widest stripe writing.

When LBAs corresponding to pieces of data received from the host 2 are sequential to each other, if data are written into the NAND-type flash memory 20 by the widest stripe writing, it is possible to simultaneously read data from respective channels of the NAND-type flash memory 20. Thus, performance of sequential reading can be improved.

Figures 7, 8:
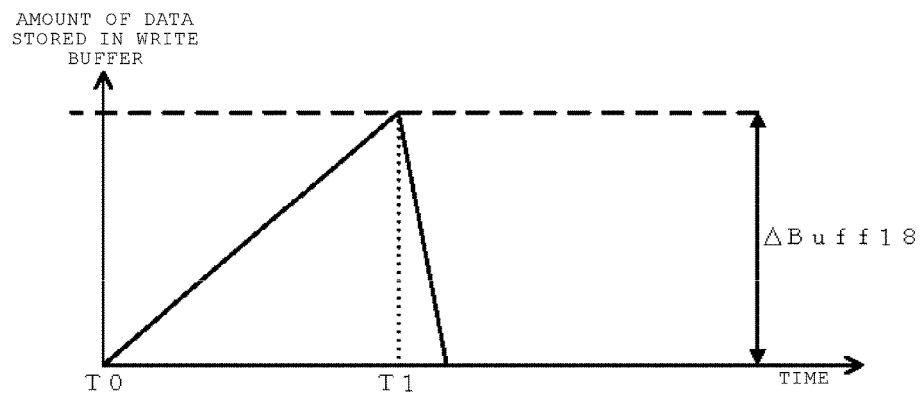
FIG. 7 illustrates a first write method according to the first embodiment.
FIG. 8 illustrates transition of an amount of data stored in a write buffer according to the first embodiment.

FIG. 8 illustrates transition of an amount of data stored in a write buffer 210 when the memory controller 10 according to the present embodiment writes data amounting to a single logical page into the NAND-type flash memory 20 by widest stripe writing.

At timing T0, the data packet generation unit 220 stores data in the write buffer 210 and allocates MCO=0 of a certain logical page 700 to the stored data. Thereafter, a piece of data corresponding to MCO=1, a piece of data corresponding to MCO=2, ..., are stored in the write buffer 210 in the order of being received from the host 2. After a piece of data corresponding to MCO=269 is stored in the write buffer 210, at timing T1, a piece of data corresponding to MCO=270 is stored in the write buffer 210.

When the piece of data corresponding to MCO=270 is stored in the write buffer 210, the size of the data stored in the write buffer 210 reaches a size of a single physical page of the NAND-type flash memory Ch0. Then, the buffer read control unit 320 transfers the data from the write buffer 210 to the page buffer 22 in the NAND-type flash memory Ch0.

Thereafter, when apiece of data corresponding to MCO=271 is stored in the write buffer 210 similarly, data of 16 clusters are transferred from the write buffer 210 to the page buffer 22 in the NAND-type flash memory Ch1, and when data of one cluster corresponding to MCO=272 are stored in the write buffer 210, data of 16 clusters are transferred from the write buffer 210 to the page buffer 22 in the NAND-type flash memory Ch2. In this way, storing and transferring of data are performed.

Here, the maximum amount (ΔBuff18) of data stored in the write buffer 210 reaches 271 clusters ranging from MCO=0, 18, 36, 252, and 270.

Figure 9:
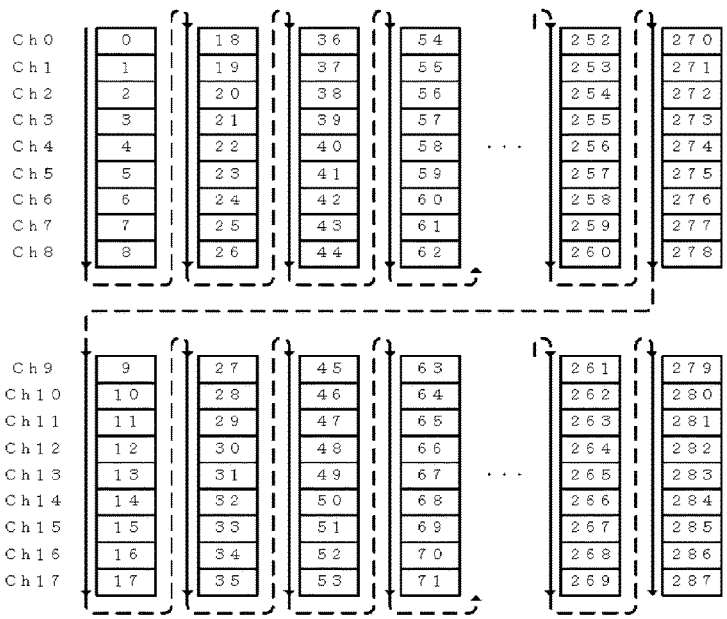
FIG. 9 illustrates a second write method according to the first embodiment.

Next, a second method of writing data into the NAND-type flash memory 20 by the memory controller 10 according to the present embodiment will be described with reference to FIG. 9.

According to the second method, the memory controller 10 arranges pieces of data received from the host 2 in order of MCO within each group of 9 channels of the NAND-type flash memory 20; i.e. a 9-channel wide breadth-first manner. That is, in each logical page 700, a piece of data received first is arranged at MCO=0, a piece of data subsequently received is arranged at MCO=1, and a piece of data subsequently received is arranged at MCO=2. A piece of data received subsequent to MCO=8 is arranged at MCO=18. Apiece of data received subsequent to MCO=278 is arranged at MCO=9.

Here, although the method for writing data in order of MCO within each group of 9 channels is described, according to the second method, it is possible to write data in order of MCO within each group of any number of channels except for one and the total number of channels. In the following, the second method for writing data in order of MCO within each group of N channels is denoted as N-channels wide stripe writing. The widest stripe writing described above corresponds to 18-channels wide stripe writing.

When LBAs corresponding to pieces of data received from the host 2 are sequential to each other, by writing data into the NAND-type flash memory 20 by N-channels wide stripe writing, it is possible to improve performance of sequential reading in a range of the N channels.

Figure 10:
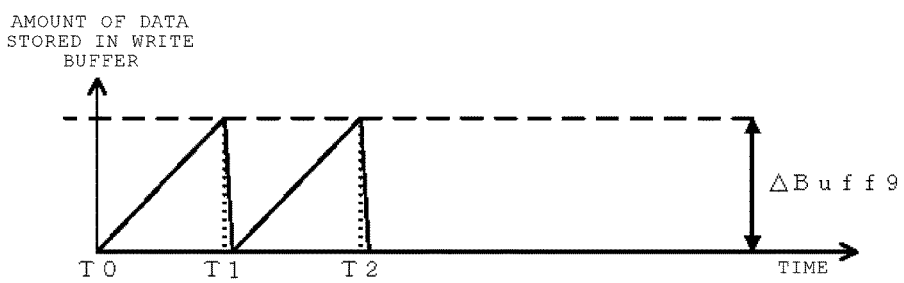
FIG. 10 illustrates transition of the amount of data stored in the write buffer according to the first embodiment.

FIG. 10 illustrates transition of an amount of data stored in the write buffer 210 when the memory controller 10 according to the present embodiment writes data amounting to a single logical page into the NAND-type flash memory 20 by the 9-channels wide stripe writing.

At timing T0, the data packet generation unit 220 stores data into the write buffer 210 and allocates MCO=0 of a certain logical page 700 to the stored data. Thereafter, a piece of data of MCO=1, a piece of data corresponding to MCO=2, ..., are stored in the write buffer 210 in the order of being received from the host 2. After a piece of data corresponding to MCO=8 is stored in the write buffer 210, apiece of data corresponding to MCO=18 is stored in the write buffer 210. After a piece of data of MCO=260 is stored in the write buffer 210, at timing T1, a piece of data corresponding to MCO=270 is stored in the write buffer 210.

When a piece of data of MCO=270 is stored in the write buffer 210, the size of the data stored in the write buffer 210 reaches a size of a single physical page of the NAND-type flash memory Ch0. Thus, the buffer read control unit 320 transfers data of 16 clusters from the write buffer 210 to the page buffer 22 in the NAND-type flash memory Ch0.

Thereafter, when data corresponding to MCO=271 is stored in the write buffer 210 similarly, data of 16 clusters are transferred from the write buffer 210 to the page buffer 22 in the NAND-type flash memory Ch1. When data corresponding to MCO=272 are stored in the write buffer 210, data of 16 clusters are transferred from the write buffer 210 to the page buffer 22 in the NAND-type flash memory Ch2. In this way, storing and transferring of data are performed.

Similarly, after pieces of data of MCO=9, 10, . . . , 17, 27, 28, . . . , 268, 269 are stored in the write buffer 210, at timing T2, a piece of data of MCO=279 is stored in the write buffer 210.

When a piece of data of MCO=279 is stored in the write buffer 210, the size of the data stored in the write buffer 210 reaches a size of a single physical page of the NAND-type flash memory CH9. Then, the buffer read control unit 320 transfers data of 16 clusters from the write buffer 210 to the page buffer 22 in the NAND-type flash memory Ch9.

Thereafter, when a piece of data of MCO=280 is stored in the write buffer 210 similarly, data of 16 clusters are transferred from the write buffer 210 to the page buffer 22 in the NAND-type flash memory Ch10. When a piece of data of MCO=281 is stored in the write buffer 210, a piece of the data is transferred from the write buffer 210 to the page buffer 22 in the NAND-type flash memory Ch11. In this way, storing and transferring of a piece of data are performed.

In this case, the maximum amount (ΔBuff9) of data stored in the write buffer 210 reaches 136 clusters that correspond to MCO=0, 1, . . . , 8, 18, 19, . . . , 259, 260, 270. The timing (T1), at which the transfer of data to the page buffer 22 in the NAND-type flash memory Ch0 is started, is earlier than that of the widest stripe writing.

Next, a third method of writing data into the NAND-type flash memory 20 by the memory controller 10 according to the present embodiment will be described with reference to FIG. 11.

According to the third method, the memory controller 10 arranges pieces of data received from the host 2 in the order of MCO within each channel of the NAND-type flash memory 20; i.e. a depth-first manner or one-channel-wide breadth-first manner. That is, in each logical page 700, apiece of data received first is arranged at MCO=0, a piece of data subsequently received is arranged at MCO=18, and a piece of data subsequently received is arranged at MCO=36. A piece of data received subsequent to MCO=270 is arranged at MCO=1. In the following, the third method is denoted as narrowest stripe writing. The narrowest stripe writing corresponds to 1-channel wide stripe writing.

Figures 11, 12:
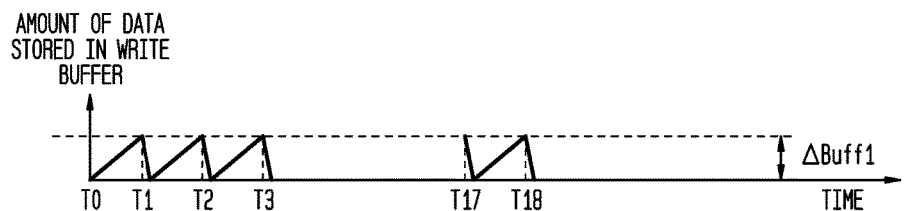
FIG. 11 illustrates a third write method according to the first embodiment.
FIG. 12 illustrates transition of the amount of data stored in the write buffer according to the first embodiment.

FIG. 12 illustrates transition of an amount of data stored in the write buffer 210 when the memory controller 10 according to the present embodiment writes data amounting to a single logical page into the NAND-type flash memory 20 by the narrowest stripe writing.

At timing T0, the data packet generation unit 220 stores data in the write buffer 210 and allocates MCO=0 of a certain logical page to the stored data. Thereafter, a piece of data of MCO=18, a piece of data of MCO=36, . . . , are stored in the write buffer 210 in the order of being received from the host 2. After data of MCO=252 is stored in the write buffer 210, at timing T1, a piece of data of MCO=270 is stored in the write buffer 210.

When a piece of data of MCO=270 is stored in the write buffer 210, the size of the data stored in the write buffer 210 reaches a size of a single physical page of the NAND-type flash memory Ch0. Thus, the buffer read control unit 320 transfers data of 16 clusters from the write buffer 210 to the page buffer 22 in the NAND-type flash memory Ch0.

Thereafter, simultaneously, when pieces of data of MCO=1, 19, 37, . . . , 253, 271 are stored in the write buffer 210, at timing T2, data of 16 clusters are transferred from the write buffer 210 to the page buffer 22 in the NAND-type flash memory Ch1. When pieces of data of MCO=2, 20, 38, . . . , 254, 272 are stored in the write buffer 210, at timing T3, data of 16 clusters are transferred from the write buffer 210 to the page buffer 22 in the NAND-type flash memory Ch2. In this way, storing and transferring of pieces of data are performed.

In this case, the maximum amount (ΔBuff1) of data stored in the write buffer 210 reaches 16 clusters that correspond to MCO=0, 18, 36, . . . , 252. The timing (T1), at which data transfer to the page buffer 22 in the NAND-type flash memory Ch0 is started, is earlier than that of the widest stripe writing or the 9-channels wide stripe writing.

As described above, in the N-channels wide stripe writing (1<N<18), performance of sequential reading is increased as N is increased. On the other hand, there is a possibility that as N is increased, an amount of data stored in the write buffer 210 is increased and the required size of the write buffer may grow large.

Among write methods described above, only one method may be employed in the semiconductor memory device 1. Alternatively, in the semiconductor memory device 1, different write methods may be employed for each logical block 800 or for each logical page 700. Next, a configuration of a write data arrangement table 1000 stored in the write data arrangement table 230 according to the present embodiment will be described with reference to FIG. 13A to FIG. 13C.

In FIG. 13A to FIG. 13C, WtCnt indicates a sequence number of data stored in the write buffer 210, in a unit of cluster. The MCO indicates MCO corresponding to each WtCnt. Each figure illustrates a single table in two columns. That is, each table in FIG. 13 A to FIG. 13C is a single table including WtCnt=0 to WtCnt=287.

A write data arrangement table 1000a illustrated in FIG. 13A is used for widest stripe writing. A write data arrangement table 1000b illustrated in FIG. 13B is used for 9-channels wide stripe writing. A write data arrangement table 1000c illustrated in FIG. 13C is used for narrowest stripe writing. In the write data arrangement table 230, the write data arrangement table 1000 for N-channels wide stripe writing other than N=18 (widest stripe writing), N=9, N=1 (narrowest stripe writing) may be stored.

Next, details of a configuration of the data packet generation unit 220 according to the present embodiment will be described with reference to FIG. 14.

The data packet generation unit 220 divides data received from the host IF control unit 100 into pieces of data of a packet size (4 kB). When data of a single cluster are received, the data packet generation unit 220 increments a write counter 222. When data amounting to a single logical page are received, the data packet generation unit 220 increments a logical page counter 224. A value of the write counter 222 is the WtCnt described above.

The data packet generation unit 220 maintains a current write method in a logical block management table 1100 as will be described below. The data packet generation unit 220 refers to the write data arrangement table 1000 according to the write method by using the WtCnt as an index so as to determine the MCO. When the widest stripe writing is used, the data packet generation unit 220 refers to the write data arrangement table 1000a. When the 9-channels wide stripe writing is used, the data packet generation unit 220 refers to the write data arrangement table 1000b. When the narrowest stripe writing is used, the data packet generation unit 220 refers to the write data arrangement table 1000c.

The data packet generation unit 220 generates a data packet 900 using these pieces of information. The generated data packet 900 is stored in the write buffer 210.

The buffer read control unit 320 determines a timing to read the data packet 900 from the write buffer 210 and a target NAND controller 310 to which the data packet 900 is to be transferred according to the write method and MCO in the data packet 900. As a result, writing of data into the NAND-type flash memory 20 is carried out according to the write method as described above.

In the above description, writing of data according to the present embodiment is explained. In the following, writing of stream data will be described.

Recently, in order to reduce the number of times of data erasing, a technology that collects a set of data having the same life cycle, that is, a set of data (in the following, referred to as a stream data), which is collectively invalidated at the time of the invalidation by the host, in the same unit of erasing of data from the nonvolatile semiconductor memory is adopted.

When the host invalidates certain data, the host may perform (1) issuing of a write command that designates a logical address which is the same as that of the corresponding data and transmitting of write data, (2) issuing of a command (for example, UNMAP command stipulated in the SCSI standard) instructing to invalidate the data, (3) issuing of a command (for example, FORMAT UNIT command stipulated in the SCSI standard) which instructs initialization of all regions of the memory device, or the like.

Figures 16, 17:
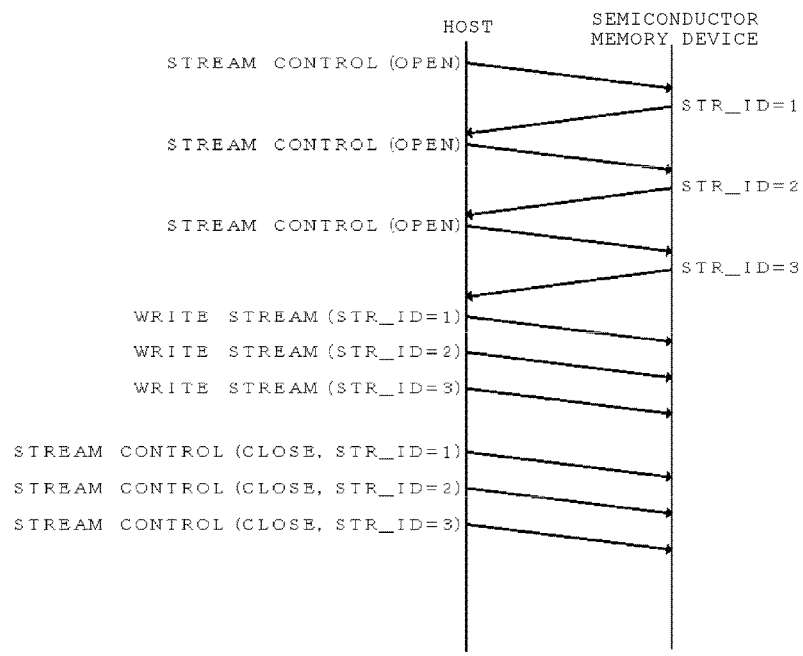
FIG. 16 illustrates a WRITE STREAM command conforming to the SCSI standard.
FIG. 17 illustrates a sequence when stream data are transferred conforming to the SAS standard.

FIG. 15 and FIG. 16 illustrate an example of commands used in writing of stream data in the SCSI standard including the SAS standard.

A STREAM CONTROL command illustrated in FIG. 15 is a command that the host 2 requests the semiconductor memory device 1 to allocate an identifier (stream ID) for identifying respective pieces of stream data. The STREAM CONTROL command is also used in order for the host 2 to request the semiconductor memory device 1 to release the stream ID which is no longer necessary.

In a STR_CTL field, 01b indicates an allocation request (OPEN) for the stream ID and 10b indicates a release request (CLOSE) for the stream ID. The stream ID to be released is designated by the STR_ID field. In the following, a STREAM CONTROL command of which the STR_CTL field is 01b is denoted by a STREAM CONTROL (OPEN) command, and a STREAM CONTROL command of which the STR_CTL field is 10b is denoted by a STREAM CONTROL (CLOSE) command.

A WRITE STREAM command illustrated in FIG. 16 is used in writing of stream data. The host 2 designates a stream ID allocated by the semiconductor memory device 1 according to the STREAM CONTROL (OPEN) command in the STR_ID field and issues a command to the semiconductor memory device 1.

Next, an example of a sequence when stream data are transferred in the SAS standard will be described with reference to FIG. 17. For simplification, description regarding frames, such as a XFER_RDY (transfer ready) frame, RESPONSE frame, or DATA frame, needed for execution of a command in the SAS standard is omitted.

First, the host 2 issues the STREAM CONTROL (OPEN) command to request allocating a stream ID. The semiconductor memory device 1 notifies the host 2 the allocated stream ID=1 after processing, for example, allocating an available space of the write buffer 210. Similarly, the facts that the stream IDs=2 and 3 are allocated by the semiconductor memory device 1 are notified to the host 2.

The host 2 uses the allocated stream IDs=1, 2, and 3 to issue the WRITE STREAM command and performs a transfer of stream data. The host 2 recognizes life cycles of respective pieces of stream data. The host 2 does not transfer pieces of stream data of which life cycles are different using the same stream ID. For example, pieces of data transferred by the WRITE STREAM command having the stream ID=1 are collectively invalidated when the host 2 invalidates the pieces of data.

When the transfer of stream data is completed, the host 2 issues a STREAM CONTROL (CLOSE) command and requests a release of stream IDs=1, 2, and 3 which are no longer necessary.

Figure 18:
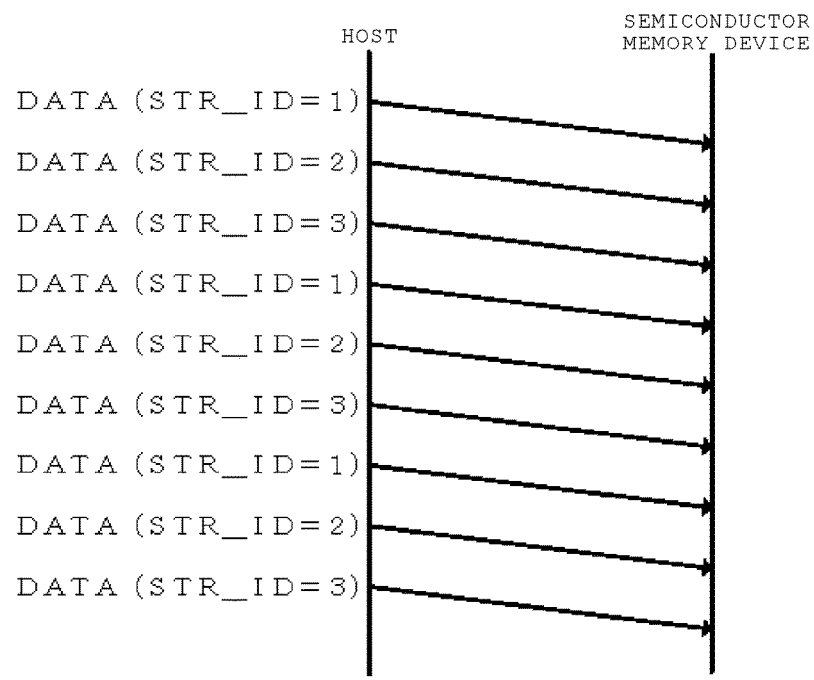
FIG. 18 illustrates a sequence when stream data are transferred conforming to the SAS standard.

Commands are able to be queued and executed according to the SAS standard. Thus, as illustrated in FIG. 18, for example, a piece of stream data having stream ID=2 or stream ID=3 can be transferred before the transfer of all piece of stream data having the stream ID=1 is completed.

Figure 19:
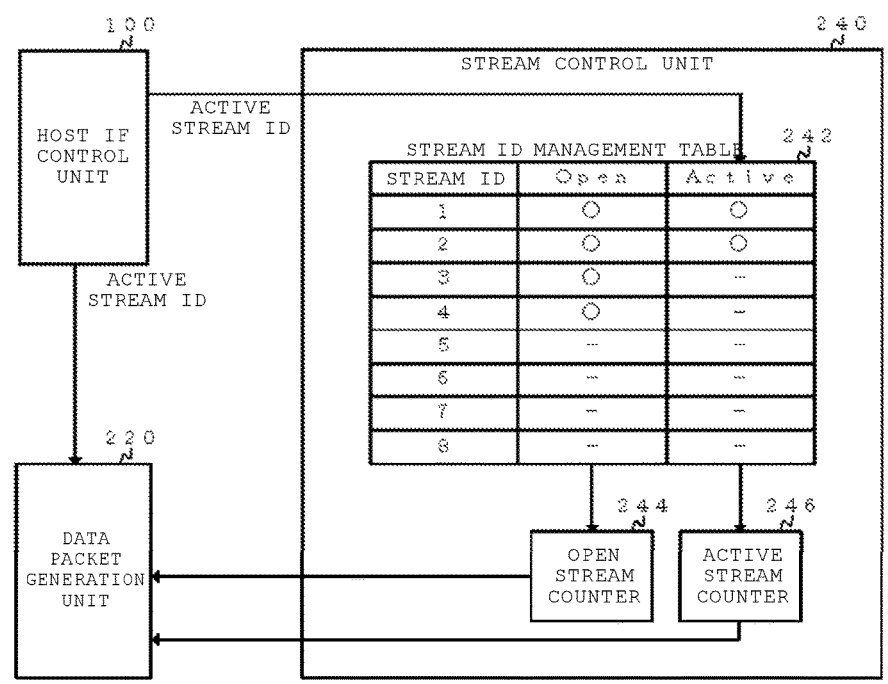
FIG. 19 is a block diagram of a stream control unit according to the first embodiment.

Next, a configuration of the stream control unit 240 according to the present embodiment will be described with reference to FIG. 19.

The stream control unit 240 includes the stream ID management table 242 for managing a stream ID allocated to the host 2. The stream ID management table 242 includes a stream ID, an Open flag, and an Active flag. In the present embodiment, a maximum of eight stream IDs may be allocated to the host 2.

When the STREAM CONTROL (OPEN) command is received from the host 2, the CPU 500 retrieves a stream ID capable of being allocated from the stream ID management table 242 based on control of FW and controls the host IF control unit 100 to notify the host 2 of the allocated stream ID. Then, the CPU 500 sets an Open flag of the stream ID management table 242 for the allocated stream ID.

When the host 2 starts the transfer of stream data, the host IF control unit 100 acquires a stream ID from a header of a DATA frame and notifies the acquired stream ID (that is, a stream ID of a piece of stream data which is actually transferred from the host 2; in the following, denoted as an active stream ID) of each piece of stream data to the stream control unit 240.

Upon receiving the notification of the active stream ID, the stream control unit 240 sets an Active flag for the stream ID in the stream ID management table. After the transfer of the stream data is completed, when the host 2 issues the STREAM CONTROL (CLOSE) command to request releasing the stream ID which is no longer necessary, the CPU 500 clears the Open flag and Active flag of the stream ID management table 242 for the stream ID.

The number of stream IDs for which Open flag is set is counted by an open stream counter 244 and the number of stream IDs for which Active flag is set is counted by the active stream counter 246. In FIG. 19, the stream IDs=1, 2, 3, and 4 are allocated to the host 2 and the transfer of stream data is started for the stream IDs=1 and 2. Accordingly, a value of the open stream counter 244 is 4 and a value of the active stream counter 246 is 2.

The active stream ID is also output to the data packet generation unit 220, and as will be described below, a data packet 900 is generated such that a suitable piece of stream data is written into each logical block 800. The values of the open stream counter 244 and the active stream counter 246 are also output to the data packet generation unit 220. These values of the counters are used as conditions to change the write method.

When a number of the STREAM CONTROL (OPEN) commands that exceeds the number of stream IDs that can be allocated to the host 2 are received, the semiconductor memory device 1 notifies the host 2 of an error. When it is requested to report the number of the allocated stream IDs by a GET STREAM STATUS command (not illustrated), the value of the open stream counter 244 may be reported.

Figures 20, 21:
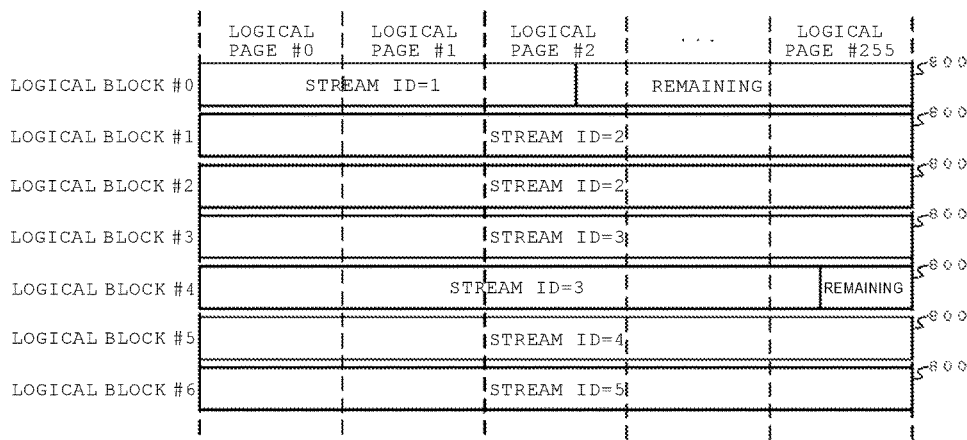
FIG. 20 illustrates a stream ID allocated to a logical block according to the first embodiment.
FIG. 21 illustrates a configuration of a logical block management table according to the first embodiment.

Next, an example of stream IDs allocated to each logical block 800 upon writing stream data according to the present embodiment will be described with reference to FIG. 20. In FIG. 20, an example of stream IDs allocated to logical blocks #0 to #6 is illustrated.

As described above, pieces of stream data having the same Id are collectively invalidated. Multiple stream IDs are not allocated in one logical block 800 which is a unit of erasing data by the memory controller 10. That is, in one logical block of #0 to #6, stream data with one stream ID are written On the other hand, a single stream ID may be allocated to a plurality of logical blocks 800, shows as the stream ID=2 is allocated to logical blocks #1 and #2. When all regions of the logical block 800 are not filled with stream data having the same stream ID like the logical blocks #0 and #4, zero data are filled in the remaining space.

Next, an example of a configuration of the logical block management table 1100 installed in the data packet generation unit 220 according to the present embodiment will be described with reference to FIG. 21.

When a stream ID is allocated according to the STREAM CONTROL (OPEN) command, the CPU 500 registers a logical block ID of a corresponding logical block 800 and a write method for the logical block 800 in the logical block management table 1100. The write method is set as, for example, the widest stripe writing if higher performance in sequential reading is desired.

Respective logical blocks 800 and stream IDs illustrated in FIG. 21 correspond to those in FIG. 20. That is, the logical block #0 is allocated to the stream ID=1, the logical block #1 and the logical block #2 are allocated to the stream ID=2, the logical block #3 and logical block #4 are allocated to the stream ID=3, the logical block #5 is allocated to the stream ID=4, and the logical block #6 is allocated to the stream ID=5.

The data packet generation unit 220 looks up the logical block management table 1100 using an active stream ID input from the host IF control unit 100 as an index, acquires the number of the logical block 800 and the write method, and generates the data packet 900.

Figure 22:
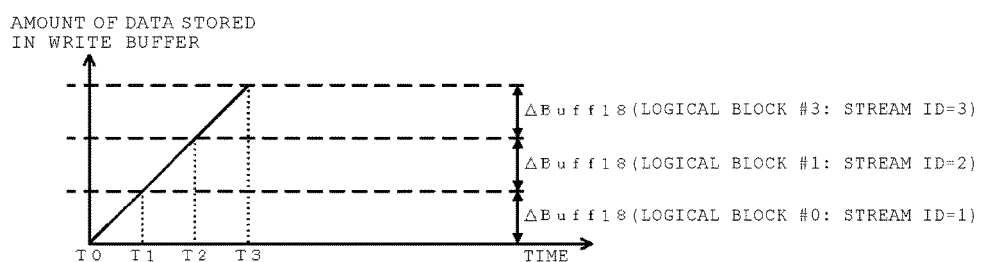
FIG. 22 illustrates transition of the amount of data stored in the write buffer according to the first embodiment.

Next, description will be made on example of transition of the amount of data stored in the write buffer 210 when the memory controller 10 according to the present embodiment writes a plurality of pieces of stream data into the NAND-type flash memory 20 with reference to FIG. 22. Respective logical blocks 800 and stream IDs illustrated in FIG. 20 and FIG. 21 correspond to those in FIG. 22.

At timing T0, the data packet generation unit 220 starts to store a piece of stream data (stream ID=1) to be written into a logical page #0 of a logical block #0 by the widest stripe writing to the write buffer 210. On the other hand, it is assumed that the host 2 starts the transfer of a piece of stream data of the stream ID=2, which is queued and executed, at timing T1 after the piece of stream data of the stream ID=1 is stored in the write buffer 210 with an amount of ΔBuff18.

In this case, while the piece of stream data of the stream ID=1 is not transferred from the write buffer 210 to a page buffer 22 in the NAND-type flash memory Ch0, the data packet generation unit 220 needs to store the piece of stream data (stream ID=2) to be written into a logical page #0 of a logical block #1 by the widest stripe writing in the write buffer 210.

Similarly, it is assumed that the host 2 starts the transfer of a piece of stream data of the stream ID=3, which is queued and executed, at timing T2 after the piece of stream data of the stream ID=2 was stored in the write buffer 210 with the amount of ΔBuff18.

Also, in this case, while the piece of stream data of the stream ID=2 is not transferred from the write buffer 210 to the page buffer 22 in the NAND-type flash memory Ch0, the data packet generation unit 220 needs to store the piece of stream data (stream ID=3) to be written into a logical page #0 of a logical block #3 by the widest stripe writing in the write buffer 210.

Here, it is assumed that the host 2 starts the transfer of a piece of stream data of the stream ID=4, which is queued and executed, at timing T3 after the piece of stream data of the stream ID=3 was stored in the write buffer 210 with the amount of ΔBuff18.

In this case, the amount of data stored in the write buffer 210 exceeds a predetermined threshold value. Thus, the data packet generation unit 220 changes the write methods for subsequent stream IDs to the 9-channels wide stripe writing.

Figure 23:
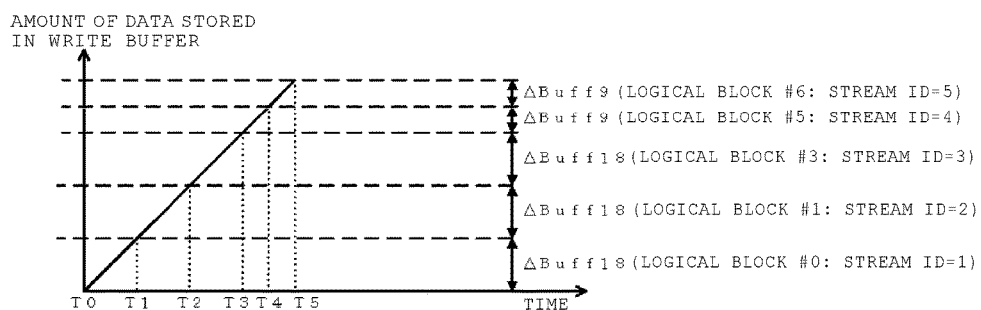
FIG. 23 illustrates transition of in the amount of data stored in the write buffer according to the first embodiment.

As a result, as illustrated in FIG. 23, the maximum amount of data stored in the write buffer 210 is ΔBuff9 per stream and the exhaustion of an available space of the write buffer 210 can be prevented. Although not illustrated, when the amount of data stored in the write buffer 210 is further increased, the write method may be changed into the narrowest stripe writing.

Figure 24:
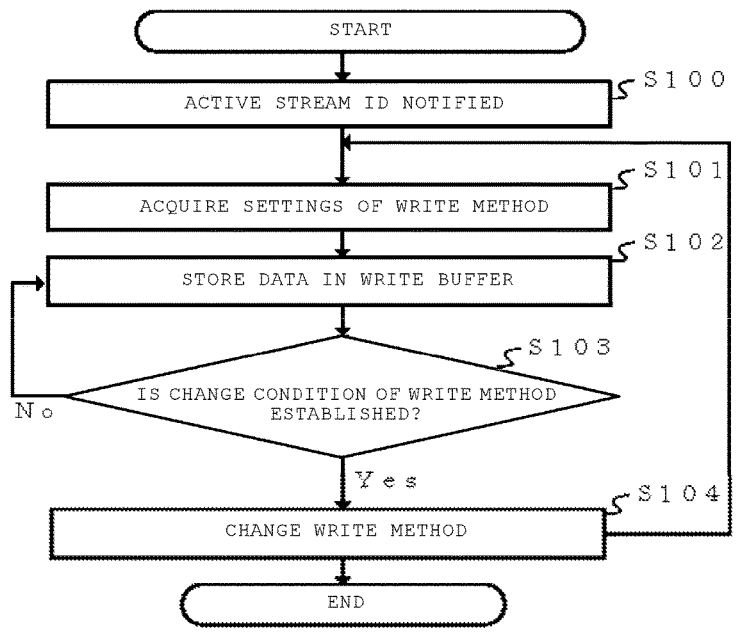
FIG. 24 illustrates operations of the data packet generation unit according to the first embodiment.

Next, operations of the data packet generation unit 220 will be described with reference to FIG. 24 according to the present embodiment.

When a notification of an active stream ID is received from the host IF control unit 100 (S100), the data packet generation unit 220 looks up the logical block management table 1100 to acquire settings of a write method (S101). A write method initially set by the CPU 500 is, for example, the widest stripe writing, and the data packet generation unit 220 obtains the MCO according to the write data arrangement table 1000a for the widest stripe writing and stores data in the write buffer 210 (S102).

The data packet generation unit 220 monitors whether the condition for changing a write method is met while data are stored in the write buffer 210 (S103). When the condition is met (Yes in S103), the write method is changed by reorganizing the logical block management table 1100 (S104).

An example of changing write method includes a change from the widest stripe writing to the 9-channels wide stripe writing due to an increase in the amount of data stored in the write buffer 210, a change from the 9-channels wide stripe writing to the widest stripe writing due to a decrease in the amount of data stored in the write buffer 210, or the like.

The data packet generation unit 220 obtains the MCO according to the write data arrangement table 1000 in accordance with the changed write method and continues storing of data into the write buffer 210 (S101 and S102).

Figure 25:
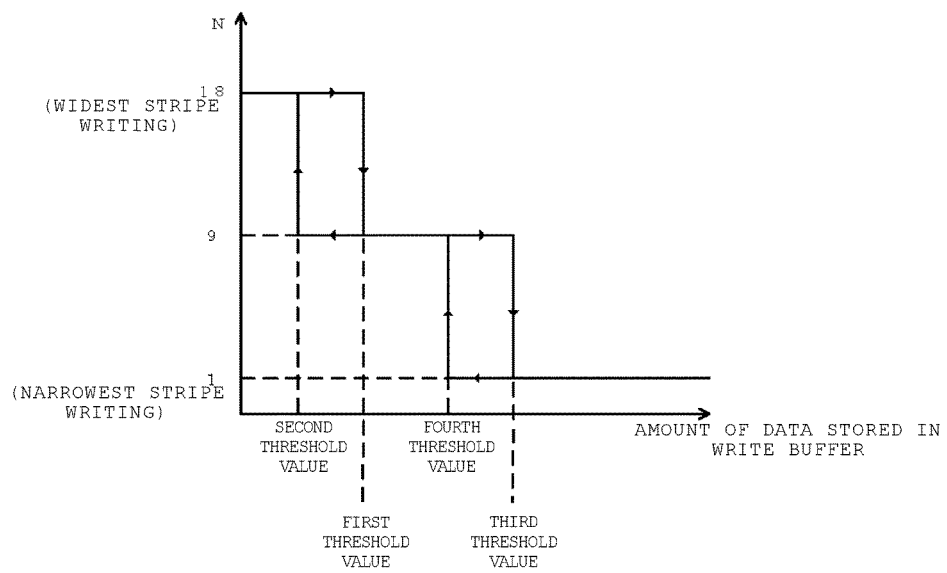
FIG. 25 illustrates a change condition in a write method according to the first embodiment.

Next, a change condition of the write method according to the present embodiment will be described with reference to FIG. 25.

When the amount of data stored in the write buffer 210 is small, the widest stripe writing is selected for higher performance of sequential reading. When the amount of data stored in the write buffer 210 is increased to be greater than or equal to a first threshold value, the 9-channels wide stripe writing is selected. When the amount of data stored in the write buffer 210 is further increased to be greater than or equal to a third threshold value, the narrowest stripe writing is selected.

On the other hand, when the amount of data stored in the write buffer 210 is decreased, a different threshold value is used. That is, when the narrowest stripe writing is selected as the write method, the narrowest stripe writing is kept as the write method without being changed even when the amount of data stored in the write buffer 210 is decreased to be less than or equal to the third threshold value. When the amount of data stored in the write buffer 210 is further decreased to be less than or equal to a fourth threshold value (it is assumed that the fourth threshold value<the third threshold value), the 9-channels wide stripe writing is selected as the write method. Similarly, when the 9-channels wide stripe writing is selected as the write method, the 9-channels wide stripe writing is kept as the write method without being changed even when the amount of data stored in the write buffer 210 is decreased to be less than or equal to the first threshold value. When the amount of data stored in the write buffer 210 is further decreased to be less than or equal to a second threshold value (it is assumed that the second threshold value<the first threshold value), the widest stripe writing is selected as the write method.

In the above description, the condition to change the write method is based on the amount of data stored in the write buffer 210. Alternatively, a value of the open stream counter 244 or a value of the active stream counter 246 may be employed as the condition to change the write method. More than four kinds of threshold values may be employed and more than three kinds of write methods may be selected. It may be acceptable that the second threshold value equals to the first threshold value and the fourth threshold value equals to the third threshold value.

In the semiconductor memory device according to the first embodiment as described above, the write method is changed in accordance with a transfer status of stream data. Thus, it is possible to prevent an available space of the write buffer from being exhausted and improve the performance of sequential reading, and therefore improve the performance of the semiconductor memory device.

Second Embodiment

In the semiconductor memory device according to the first embodiment, the write method is changed depending on the amount of data stored in the write buffer or the number of stream IDs. By contrast, the write method is also changed depending on sequential property of stream data in the semiconductor memory (storage) device according to a second embodiment.

Figure 26A:
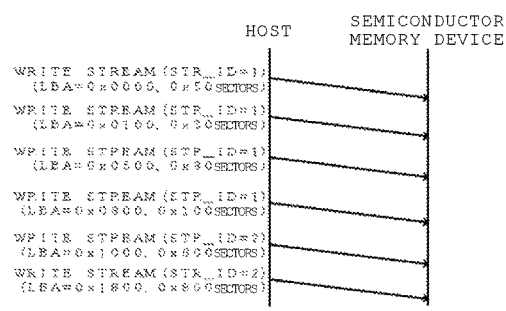
FIGS. 26A and 26B illustrate a command sequence when a plurality of WRITE STREAM commands conforming to the SCSI standard is issued.

FIG. 26A illustrates an example of command sequence when the host 2 issues a plurality of WRITE STREAM commands using the same stream ID.

The host 2 issues, using the stream ID=1, four WRITE STREAM commands of a WRITE STREAM command to transfer stream data in a range from a start LBA=0x0000 with a transfer length=0x50 sectors, a WRITE STREAM command to transfer stream data in a range from a start LBA=0x0100 with a transfer length=0x30 sectors, a WRITE STREAM command to transfer stream data in a range from a start LBA=0x0500 with a transfer length=0x80 sectors, and a WRITE STREAM command to transfer stream data in a range from a start LBA=0x0800 with a transfer length=0x100 sectors.

On the other hand, using the stream ID=2, the host 2 issues two WRITE STREAM commands of a WRITE STREAM command to transfer stream data in a range from a start LBA=0x1000 with a transfer length=0x800 sectors and a WRITE STREAM command to transfer stream data in a range from a start LBA=0x1800 with a transfer length=0x800 sectors.

Figure 26B:
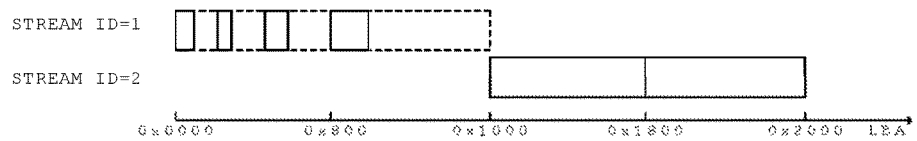

LBAs of the stream data transmitted from the host 2 are illustrated in FIG. 26B. A solid line portion in FIG. 26B illustrates a range of LBAs for which pieces of stream data are transmitted. A dotted line portion in FIG. 26B illustrates a range of LBAs for which pieces of stream data are not transmitted. The sequential property of the stream data having the stream ID=1 is low and the sequential property of the stream data having the stream ID=2 is high.

As described above, in the N-channels wide stripe writing, the performance of sequential reading gets increased as N increases. Thus, the N-channels wide stripe writing is desirably performed using as large N as possible for stream data of the stream ID=2.

Figure 27A:
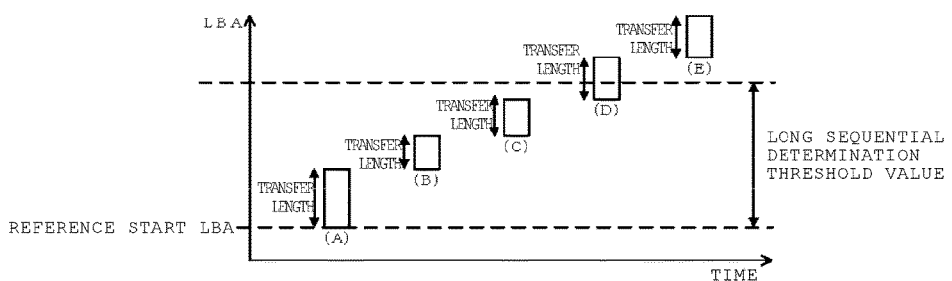
FIGS. 27A and 27B illustrate an algorithm used for determining a sequential property by a semiconductor storage device according to a second embodiment.
Figure 27B:
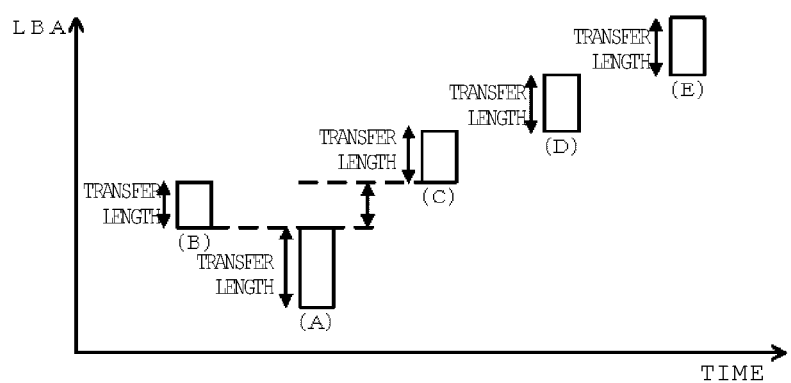

Next, an algorithm for determining a sequential property in the second embodiment will be described with reference to FIG. 27A and FIG. 27B. FIG. 27A and FIG. 27B illustrate a start LBA and the transfer length of stream data (in the following, referred to as data (A) to data (E)) associated with a write command (A) to a write command (E).

In the semiconductor memory device 1 according to the second embodiment, the stream control unit 240 determines the sequential property using a start LBA and the transfer length input from the host IF control unit 100. The stream control unit 240 stores a start LBA as a reference of stream data having the same stream ID. That is, in the example illustrated in FIG. 27A, the stream control unit 240 stores a start LBA of the data (A) as a reference start LBA. The stream control unit 240 stores an accumulated amount of the transfer lengths of respective data (B) to data (E) having an LBA range continuing from the LBA range of data (A). When the accumulated amount becomes greater than or equal to a predetermined long sequential determination threshold value by receiving data (D), the stream control unit 240 determines that the sequential property of the stream data is high.

Depending on a stream data transfer method of the host 2, the semiconductor memory device 1 may not always receive stream data of which sequential property is high in order of LBA. In an example illustrated in FIG. 27B, the semiconductor memory device 1 receives stream data in order of data (B), data (A), data (C), data (D), and data (E). The stream control unit 240 can determine the sequential property for stream data received as described above.

Next, description will be made on an example of a long sequential determination table 1200 (in the following, referred to as determination table 1200) used in determination of the sequential property of stream data by the stream control unit 240 according to the second embodiment with reference to FIG. 28A to FIG. 28G.

The determination table 1200 includes a plurality of entries. In the second embodiment, the determination table 1200 includes three entries. A single entry includes a start LBA, an end LBA, an accumulated amount, and a generation number. The determination table 1200 includes a long determination flag. The determination table 1200 is managed for each stream ID. That is, a single determination table 1200 corresponds to a single stream ID. The determination table 1200 may be initialized by the CPU 500 when the stream ID is allocated according to the STREAM CONTROL (OPEN) command.

In the following description, it is assumed that a long sequential determination threshold value is set to 0x700.

FIG. 28A illustrates a state of the determination table 1200 when the determination table 1200 is initialized. Although not illustrated in FIG. 28A, the start LBAs, the end LBAs, the accumulated amounts, and the generation numbers of all entries are zeros. A long determination flag is not set.

FIG. 28B illustrates a state of the determination table 1200 after when a WRITE STREAM command (command A) for stream data in a range from a start LBA=0x1000 with a transfer length=0x200 sectors is received when the determination table 1200 is in the state of FIG. 28A. For the entry 0, the start LBA is set to 0x1000 and the end LBA, which is the start LBA+the transfer length−1, is set to 0x11FF. The accumulated amount of the entry 0 is updated to the sum of the previous accumulated amount (0x000) and the transfer length (0x200) of the command A and thus, is 0x200. A generation number of an entry in which command information is newly registered is set to 1. That is, the generation number of the entry 0 is 1.

FIG. 28C illustrates a state of the determination table 1200 after when a WRITE STREAM command (command B) for stream data in a range from a start LBA=0x1200 with a transfer length=0x100 sectors is received when the determination table 1200 is in the state of FIG. 28B. The start LBA of the command B is continuous from the end LBA of the entry 0. Accordingly, information of the command B is registered in the entry 0. The start LBA of the entry 0 is kept as 0x1000 without being changed and the end LBA of the entry 0 is updated to 0x12FF which is the end LBA of the command B. The accumulated amount of the entry 0 is updated to the sum of the previous accumulated amount (0x200) and the transfer length (0x100) of the command B and thus, is 0x300. A generation number of an entry having an LBA range continuous from the LBA range of the received command is 1. That is, the generation number of the entry 0 is kept to be 1.

FIG. 28D illustrates a state of the determination table 1200 after when a WRITE STREAM command (command C) for stream data in a range from a start LBA=0x1400 to a transfer length=0x200 sectors is received when the determination table 1200 is in the state of FIG. 28C. The start LBA of the command C is not continuous from the last LBA of the entry 0. In this case, information of the command C is registered in the entry 1. The start LBA and the end LBA of the entry 1 are set to 0x1400 and 0x15FF, respectively. The accumulated amount of the entry 1 is updated to the sum of the previous accumulated amount (0x000) and the transfer length (0x200) of the command C and thus, is 0x200. A generation number of an entry in which command information is newly registered is set to 1. That is, the generation number of the entry 1 is 1. Among entries other than the entry in which command information is newly registered, the generation number of the entry of which accumulated amount is not zero is incremented by one. That is, the generation number of the entry 0 becomes 2.

FIG. 28E illustrates a state of the determination table 1200 after when a WRITE STREAM command (command D) for stream data in a range from a start LBA=0x0E00 to a transfer length=0x100 sectors is received when the determination table 1200 is in the state of FIG. 28D. The start LBA of the command D is not continuous from the end LBAs of the entry 0 or entry 1. In this case, information of the command D is registered in an entry 2. The start LBA and the end LBA of the entry 2 are respectively 0x0E00 and 0x0EFF. The accumulated amount of the entry 2 is updated to the sum of the previous accumulated amount (0x000) and the transfer length (0x100) of the command D and thus, is 0x100. A generation number of an entry in which command information is newly registered is set to 1. That is, the generation number of the entry 2 is 1. Among entries other than the entry in which command information is newly registered, the generation number of the entry of which accumulated amount is not zero is incremented by one. That is, the generation number of the entry 0 becomes 3. The generation number of the entry 1 becomes 2.

FIG. 28F illustrates a state of the determination table 1200 after when a WRITE STREAM command (command E) for stream data in a range from a start LBA=0x1300 with a transfer length=0x100 sectors is received when the determination table 1200 is in the state of FIG. 28E. The start LBA of the command E is continuous from the end LBA of the entry 0. The end LBA of the command E is continuous from the start LBA of the entry 1. In this case, information of the entry 0, information of the entry 1, information of the command E are merged and registered in an entry of which start LBA is smaller, that is, the entry 0. The start LBA of the entry 0 is kept to be 0x1000. The end LBA of the entry 0 is updated to 0x15FF which has been the end LBA of the entry 1. The accumulated amount of the entry 0 is updated to the sum of the previous accumulated amount (0x300), the accumulated amount (0x200) of the entry 1, and the transfer length (0x100) of the command E and thus, is 0x600. Among the merged entries, the generation number of the entry of which start LBA is smaller is 1. That is, the generation number of the entry 0 is 1. Among the merged entries, the entry of which start LBA is larger is initialized. That is, the entry 1 is initialized. Among entries other than the merged entries, as the generation numbers of the entries of which accumulated amounts are not zero, the integer sequence 2, 3, . . . , are assigned to the entries in ascending order of entries having smaller generation numbers. That is, the generation number, which is 1, of the entry 2 is rewritten with 2.

FIG. 28G illustrates a state of the determination table 1200 after when a WRITE STREAM command (command F) for stream data in a range from a start LBA=0x0F00 with a transfer length=0x100 sectors is received when the determination table 1200 is in the state of FIG. 28F. The start LBA of the command F is continuous from the end LBA of the entry 2. The end LBA of the command F is continuous from the start LBA of the entry 0. In this case, information of the entry 0, information of the entry 2, information of the command F are merged and registered in an entry of which the start LBA is smaller, that is, the entry 2. The start LBA of the entry 2 is kept to be 0x0E00 without being changed. The end LBA of the entry 2 is updated to 0x15FF which has been the end LBA of the entry 0. The accumulated amount of the entry 2 is updated to the sum of the previous accumulated amount (0x100), the accumulated amount (0x600) of the entry 0, and the transfer length (0x100) of the command F and thus, is 0x800. Among the merged entries, the generation number of the entry of which start LBA is smaller is 1. That is, the generation number of the entry 2 becomes 1. Among the merged entries, the entry of which start LBA is larger is initialized. That is, the entry 0 is initialized.

The accumulated amount of the entry 2 is greater than or equal to the long sequential determination threshold value (0x700). Thus, the long determination flag is set.

When the accumulated amounts of any entries are not zero and a command of which LBA range is not continuous from the start LBA and the end LBA of any of the entries, an entry of which generation number is the largest is initialized. In this case, the entry of which accumulated amount is the smallest may be initialized. Information of the received command is registered in the initialized entry.

Figure 29:
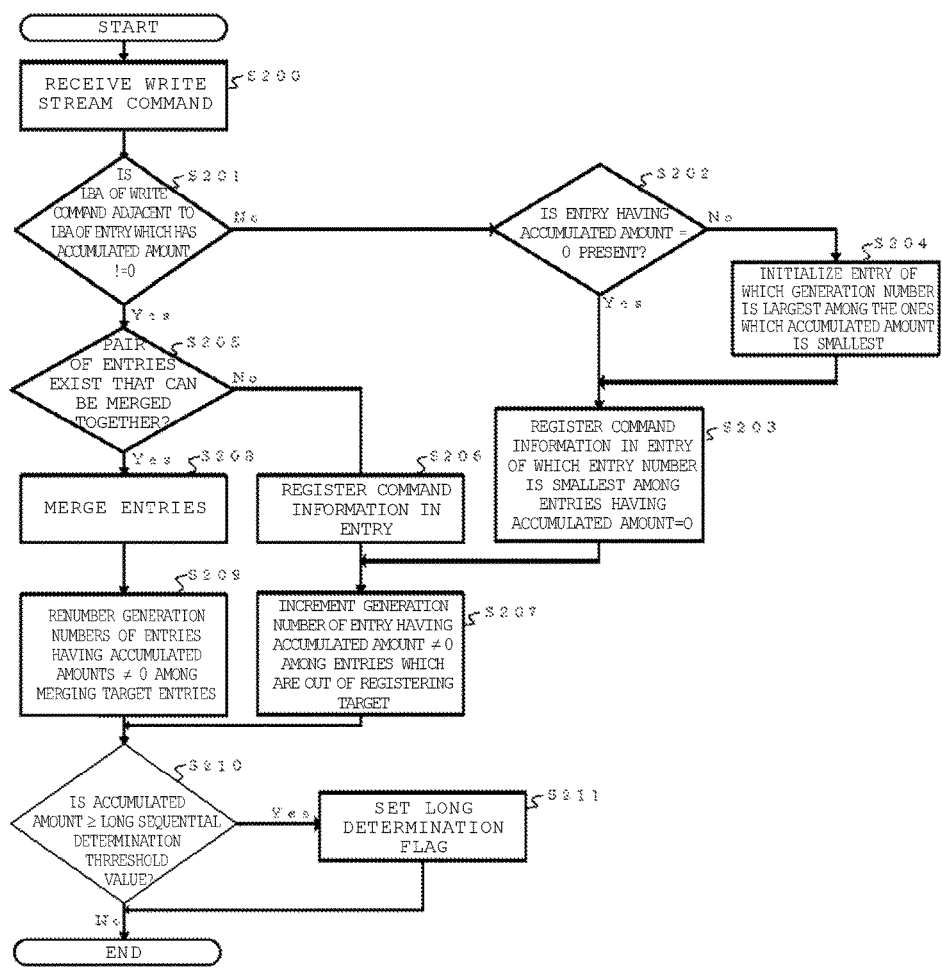
FIG. 29 illustrates an update procedure of the long sequential determination table according to the second embodiment.

Next, an update procedure of the determination table 1200 by the stream control unit 240 according to the second embodiment will be described with reference to FIG. 29.

When a WRITE STREAM command is received (S200), the stream control unit 240 determines whether or not an entry of which accumulated amount is not zero and which has the start LBA or the end LBA continuous to a LBA range of the received command is present (S201).

When the entry of which LBA is continuous is absent (No in S201), the stream control unit 240 determines whether or not an entry of which accumulated amount is zero is present (S202). When the entry of which accumulated amount is zero is present (Yes in S202), the stream control unit 240 registers the command information in an entry of which entry number is the smallest among entries of which accumulated amount is zero (S203). In this case, the generation number of the entry is 1. When the entry of which accumulated amount is zero is absent (No in S202), the stream control unit 240 initializes an entry of which generation number is the largest or the accumulated amount is the smallest (S204).

When the entry of which LBA is continuous is present (Yes in S201), the stream control unit 240 determines whether or not an entry capable of being merged is present (S205).

When an entry capable of being merged is absent (No in S205), the stream control unit 240 registers the command information in an entry having the start LBA or the end LBA continuous to the LBA range of the received command (S206). In this case, the generation number of the entry is 1. Among entries which are out of the registering target, the generation number of the entry of which accumulated amount is not zero is incremented by one (S207).

When the entry capable of being merged is present (Yes in S205), the stream control unit 240 registers information of an entry of a merging target and the command information in an entry having the smallest start LBA among one or more merging target entries (S208). In this case, the generation number of the entry is set to 1. Among the entries which are out of the merging target, the generation numbers of entries of which accumulated amounts are not zero are re-numbered in ascending order of the generation numbers to be 2, 3, . . . , (S209).

Next, the stream control unit 240 determines whether or not the accumulated amount of any of entries is greater than or equal to the long sequential determination threshold value (S210). When the applicable entry is present (Yes in S210), the long determination flag is set (S211).

Next, an example of a configuration of the logical block management table 1100 according to the second embodiment will be described with reference to FIG. 30.

In the second embodiment, a long determination flag is added to the configuration of the logical block management table 1100 of the first embodiment. The long determination flag and the stream ID are input to the data packet generation unit 220 from the stream control unit 240. In the second embodiment, the write method is set for each logical block.

As illustrated in FIG. 30, the logical block #0 is allocated to the stream ID=1, the logical blocks #1 and #2 are allocated to the stream ID=2, the logical blocks #3 and #4 are allocated to the stream ID=3, and the logical block #5 is allocated to the stream ID=4. The long determination flag is set in the stream ID=2 and the stream ID=4.

In this case, it is assumed that the write method is 9-channels wide stripe writing according to the determination condition described in the first embodiment. However, the write methods are changed to the widest stripe writing for the logical blocks #1, #2, and #5 including the stream ID for which the long determination flag is set for higher performance of sequential reading.

In FIG. 30, although the write methods of the logical blocks #0, #3, and #4 are kept as the 9-channels wide stripe writing without being changed, the write method of the logical block 800 of at least one of the logical blocks #0, #3, and #4 may be changed into the narrowest stripe writing accompanied by changing of the write methods of the logical blocks #1, #2, and #5 into the widest stripe writing. As a result, it is possible to prevent an available space of the write buffer 210 from being exhausted.

By the semiconductor memory device according to the second embodiment as described above, the write method is changed depending on the sequential property of stream data. Thus, it is possible to improve performance of sequential reading and performance of the semiconductor memory device.

By the semiconductor memory device according to at least one of the embodiments as described above, the write method is changed according to a transfer status of stream data. Thus, it is possible to prevent an empty space of the write buffer from exhausting and improve the performance of sequential reading, and therefore improve the performance of the semiconductor memory device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   m (m≥2) nonvolatile semiconductor memory chips;
   a buffer; and
   a controller configured to
      arrange, in the buffer, a first plurality of data units to be transferred to N (1≤N≤m) of the m memory chips, in an order in which each of the first plurality of data units has been received from a host, for each one of the N memory chips, and then arrange a second plurality of data units to be transferred to next N of the m memory chips, if any, in an order in which each of the second plurality of data units has been received from the host, for each one of the next N memory chips, upon the arranged data units for each memory chip having been accumulated to a certain number in the buffer, collectively transfer the certain number of arranged data units to the memory chip, and change a value of N based on an amount of data accumulated in the buffer, wherein the controller decreases the value of N when the amount of data increases to a first threshold, and increases the value of N when the amount of data decreases to a second threshold, the first threshold being greater than the second threshold.

2. The semiconductor storage device according to claim 1, wherein a data amount of the certain number of data units corresponds to a unit of writing of data in the memory chip.

3. The semiconductor storage device according to claim 1, wherein the controller further decreases the value of N when the amount of data increases to a third threshold that is greater than the first threshold.

4. The semiconductor storage device according to claim 1, wherein the controller changes the value of N further based on sequentiality of logical addresses targeted by the plurality of data units.

5. The semiconductor storage device according to claim 4, wherein the controller increases the value of N when a length of a sequential logical address range is more than a threshold.

6. A semiconductor storage device comprising:

m (m≥2) nonvolatile semiconductor memory chips;
a buffer; and
a controller configured to
    arrange, in the buffer, a first plurality of data units to be transferred to N (1≤N≤m) of the m memory chips, in an order in which each of the first plurality of data units has been received from a host, for each one of the N memory chips, and then arrange a second plurality of data units to be transferred to next N of the m memory chips, if any, in an order in which each of the second plurality of data units has been received from the host, for each one of the next N memory chips,
    upon the arranged data units for each memory chip having been accumulated to a certain number in the buffer, collectively transfer the certain number of arranged data units to the memory chip, and
    change a value of N based on an amount of data accumulated in the buffer, wherein
the controller is further configured to associate one or more blocks in each of the m memory chips with one of a plurality of stream identifiers that are managed in the controller, and selectively transfer data units associated with said one of the stream identifiers to said one or more blocks in each of the m memory chips.

7. The semiconductor storage device according to claim 6, wherein the controller is further configured to count the number of stream identifiers, and change the value of N further based on the counted number of stream identifiers.

8. The semiconductor storage device according to claim 7, wherein the controller decreases the value of N when the counted number of stream identifiers increases to a first threshold, and increases the value of N when the counted number of stream identifiers decreases to a second threshold.

9. The semiconductor storage device according to claim 7, wherein the controller is further configured to return the counted number of stream identifiers in response to a command from a host.

10. The semiconductor storage device according to claim 6, wherein the controller is further configured to count the number of stream identifiers for which data writing is being carried out, and change the value of N further based on the counted number of stream identifiers.

11. The semiconductor storage device according to claim 10, wherein the controller decreases the value of N when the counted number of stream identifiers increases to a first threshold, and increases the value of N when the counted number of stream identifiers decreases to a second threshold.

12. The semiconductor storage device according to claim 10, wherein the controller is further configured to return the counted number of stream identifiers in response to a command from a host.

13. A method of writing data in a semiconductor storage device including m (m≥2) nonvolatile semiconductor memory chips and a buffer, the method comprising:

arranging, in the buffer, a first plurality of data units to be transferred to N (1≤N≤m) of the m memory chips, in an order in which each of the first plurality of data units has been received from a host, for each one of the N memory chips, and then arranging a second plurality of data units to be transferred to next N of the m memory chips, if any, in an order in which each of the second plurality of data units has been received from the host, for each one of the next N memory chips;

upon the arranged data units for each memory chip having been accumulated to a certain number in the buffer, collectively transferring the certain number of arranged data units to the memory chip; and changing a value of N based on an amount of data accumulated in the buffer, wherein the value of N is decreased when the amount of data increases to a first threshold, and increased when the amount of data decreases to a second threshold, the first threshold being greater than the second threshold.

14. The method according to claim 13, wherein a data amount of the certain number of data units corresponds to a unit of writing of data in the memory chip.

15. The method according to claim 13, wherein the value of N is changed further based on sequentiality of logical addresses targeted by the plurality of data units.

16. The method according to claim 13, further comprising:

associating one or more blocks in each of the m memory chips with one of a plurality of stream identifiers; and selectively transferring data units associated with said one of the stream identifiers to said one or more blocks in each of the m memory chips.

17. The method according to claim 16, further comprising:
   counting the number of stream identifiers, wherein
   the value of N is changed further based on the counted number of stream identifiers.

18. The method according to claim 16, further comprising:
   counting the number of stream identifiers for which data writing is being carried out, wherein
   the value of N is changed further based on the counted number of stream identifiers.

* * * * *